United States Patent [19]
Mayfield

[11] Patent Number: 5,264,803
[45] Date of Patent: Nov. 23, 1993

[54] AMPLIFIER CIRCUIT WITH INCREASED VOLTAGE HANDLING CAPACITY

[75] Inventor: Glenn A. Mayfield, West Lafayette, Ind.

[73] Assignee: Radian Research, Inc., Lafayette, Ind.

[21] Appl. No.: 905,031

[22] Filed: Jun. 26, 1992

[51] Int. Cl.[5] .............................................. H03F 3/68
[52] U.S. Cl. ................................. 330/124 R; 330/188
[58] Field of Search ............................ 330/188-190, 330/124 R, 295

[56] References Cited

U.S. PATENT DOCUMENTS 3,223,935 12/1965 Rodaer ............................ 330/295 X Primary Examiner—James B. Mullins
Attorney, Agent, or Firm—Barnes & Thornburg

[57] ABSTRACT

A system for increasing the voltage handling capacity of an amplifier circuit coupled to a transformer output comprises a transformer secondary winding divided into n sub secondary windings, where n is an integer. A first terminal of a first of the sub secondary windings is coupled to a reference potential. n amplifiers, numbered sequentially $1 \leq m \leq n$ as they appear in the amplification circuit with an output terminal of the nth amplifier comprising an output terminal of the amplification circuit, each have an input terminal and an output terminal. An input terminal of the first amplifier is coupled to a second terminal of the first sub secondary winding. An output terminal of each of the n amplifiers is coupled to a first terminal of the next adjacent higher numbered sub secondary winding, except for the nth amplifier, the output of which comprises the output of the amplifier circuit. A first voltage supply is coupled to the first amplifier to provide operating voltage to the first amplifier, and to reference potential. $n-1$ additional voltage supplies are coupled to respective ones of the $n-1$ remaining amplifiers to provide operating voltage thereto, and to the output terminal of the next adjacent lower numbered amplifier.

4 Claims, 6 Drawing Sheets

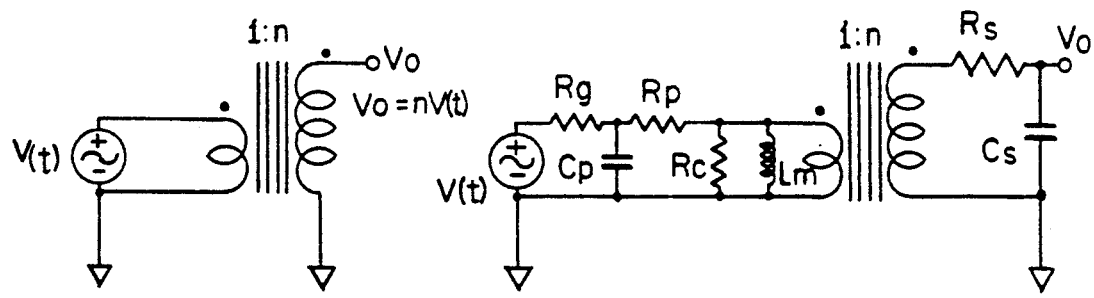
PRIOR ART
FIG. 1
PRIOR ART
FIG. 2
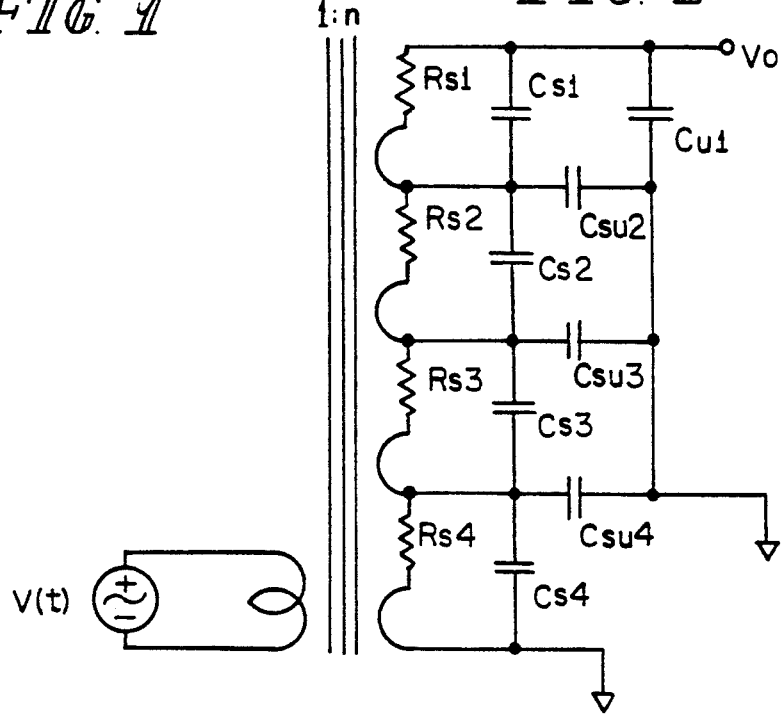
PRIOR ART
FIG. 3
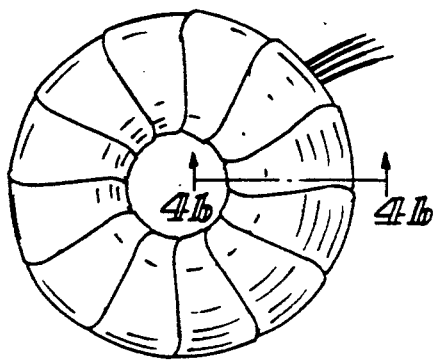
FIG. 4a
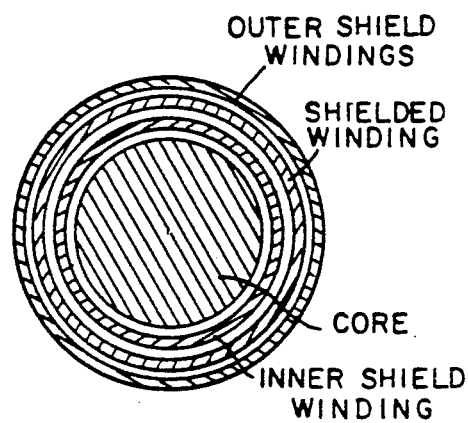
FIG. 4b

AMPLIFIER CIRCUIT WITH INCREASED VOLTAGE HANDLING CAPACITY

Potential transformers (PTs) are a special form of transformers used to multiply or divide voltages precisely for the purposes of measurement and calibration. They are frequently described as illustrated in FIG. 1. An ideal voltage source v(t) is coupled to the primary winding of an ideal transformer. The output voltage across the PT's secondary winding is proportional the input voltage at the PT's primary by the turns ratio n. In this case $v_o = nv(t)$. Unfortunately ideal transformers and voltage sources do not exist. The non-ideal components used in the real world give rise to measurement errors.

FIG. 2 illustrates a typical model for a non-ideal transformer and voltage source. $R_g$ is the resistance associated with the non-ideal voltage source. $R_p$ and $R_s$ are the resistances of the primary and secondary windings, respectively. $C_p$ and $C_s$ are the capacitances associated with the primary and secondary windings, respectively. $R_c$ and $L_m$, respectively, are the core loss resistance and magnetizing inductance associated with the transformer core. The coils are assumed to be very tightly coupled and thus the inductance associated with non-mutual flux has been ignored in this model. The illustrated transformer is an ideal 1:n transformer.

As can be seen from the schematic, the voltages v(t) and $v_o$ cause currents to flow in $C_s$ and $C_p$. These currents in turn cause voltage drops to occur in $R_g$, $R_p$, and $R_s$. These voltage drops are voltage errors in the PT. In related U.S. Ser. No. 07/905,114, filed concurrently with this application, titled COMPENSATED TRANSFORMERS, and assigned to the same assignee as this application, techniques are discussed for using an operational amplifier and an additional transformer winding to reduce the effects of winding and source resistances such as $R_g$ and $R_p$ virtually to zero. The disclosure of COMPENSATED TRANSFORMERS is incorporated herein by reference. With $R_g$ and $R_p$ reduced effectively to zero, the loading effects of $C_s$, $R_c$ and $L_m$ on the primary winding can be ignored. The effect of $C_s$ on the secondary still needs to be considered. $C_p$ and $R_g$ act as a low pass filter. This has the effect of adding phase shift to the operational amplifier. If $C_p$ is kept low enough that the phase shift from its interaction with $R_g$ does not reduce the phase margin of the operational amplifier to the point of instability, $C_p$ can also be ignored. This condition can generally be achieved. With this technique, the primary winding can be driven effectively as if it were an ideal transformer.

To understand the problems associated with capacitance in the secondary winding more easily, the model of FIG. 2 can be modified to illustrate the distributed nature of the winding resistance and capacitance. It should be noted that the model will still be the lumped approximation type. It will just be easier to see the distributed nature of the components. This model is illustrated in FIG. 3. Since U.S. Ser. No. 07/905,114 illustrates how to eliminate effectively the non-ideal aspects of a transformer from its primary, $R_g$, $R_p$, $R_c$, $C_p$ and $L_m$ have been removed from the model. Now an ideal voltage source drives an ideal primary winding. Any capacitive load reflected from the secondary to the ideal primary winding will cause the ideal voltage source to supply extra current but will not affect its voltage. The resistance of the secondary winding, $R_s$, has been broken into four resistors $R_{s1}$, $R_{s2}$, $R_{s3}$, and $R_{s4}$. These have been placed in series with the four coils illustrated in the model to demonstrate how the coil resistance is spread throughout the coil.

The secondary capacitance $C_s$ has been split into eight capacitors $C_{s1}$, $C_{s2}$, $C_{s3}$, $C_{s4}$, $C_{su1}$, $C_{su2}$, $C_{su3}$, and $C_{su4}$. The capacitors $C_{s1}$–$C_{s4}$ represent the turn to turn and layer to layer capacitances that exist in a winding. As can be seen from the schematic, the voltage across each turn or layer causes a current to flow in capacitor $C_{sx}$. This current also flows in resistor $R_{sx}$. This causes a voltage drop across resistor $R_{sx}$. This in turn causes an error in the output of the potential transformer. The capacitors $C_{su1}$–$C_{su4}$ represent the capacitances between the coil windings and the rest of the universe. In this schematic they have been illustrated as going to ground. In reality they are quite complex and very dependent on the winding geometry. They represent such parameters as the capacitance that exists between the primary and secondary windings, between the windings and nearby grounds and supplies, between the winding and the equipment housing, and so on. As can be seen from the schematic, the voltage across each capacitor $C_{sux}$ to the universe causes current to flow in each $C_{sux}$. These currents also flow in varying amounts in the resistors $R_{s1}$–$R_{s4}$. This causes additional voltage error in the potential transformer. This error is further aggravated by the fact that the capacitance to the rest of the universe tends to vary somewhat as the surroundings change. As this capacitance varies, so does its effect on the error. This cannot be calibrated out.

According to one aspect of the invention, a transformer comprises a core, a primary winding provided on the core, a secondary winding, a first shield winding provided on the core between the core and the secondary winding, and a second shield winding provided on the outside of the secondary winding.

Illustratively, the first shield winding has the same number of turns as the secondary winding.

Additionally illustratively, the second shield winding has the same number of turns as the secondary winding.

Further illustratively, each turn of the secondary winding is provided on a turn of the first shield winding.

Further illustratively, each turn of the second shield winding is provided on a turn of the secondary winding.

According to another aspect of the invention, a method of winding a toroidal transformer core comprises the steps of moving the winder back and forth as it goes around the core to create layers of windings that are narrower than the mean circumference of the core.

According to yet another aspect of the invention, a system is provided for increasing the voltage handling capacity of an amplifier circuit coupled to a transformer output. The transformer has a primary winding. The system comprises a transformer secondary winding divided into n sub secondary windings where n is an integer, and means for coupling a first terminal of a first of the sub secondary windings to a reference potential. The amplification circuit comprises n amplifiers numbered sequentially $1 \leq m \leq n$ as they appear in the amplification circuit. An output terminal of the nth amplifier comprises an output terminal of the amplification circuit. Each of the n amplifiers has an input terminal and an output terminal. Means couple an input terminal of the first amplifier to a second terminal of the first sub secondary winding. Additional means are provided for coupling an output terminal of each of the n amplifiers to a first terminal of the next adjacent higher numbered sub secondary winding, except for the nth-amplifier, the output of which comprises the output of the amplifier circuit. The system further includes n voltage supplies, a first of which is coupled to reference potential and to the first amplifier to provide operating voltage to the first amplifier. The remaining n−1 additional voltage supplies are coupled to respective ones of the n−1 remaining amplifiers to provide operating voltage thereto, and to the output terminal of the next adjacent lower numbered amplifier.

Illustratively, each of the n sub secondary windings has the same number of turns and the gain of each of the n amplifiers is substantially the same.

Further illustratively, each of the n amplifiers comprises a substantially unity gain amplifier.

Additionally illustratively, each of the n amplifiers comprises a difference amplifier, the said input terminal of each amplifier comprising the non-inverting input terminal of each difference amplifier, the said output terminal of each amplifier being coupled to that amplifier's inverting input terminal in substantially unity gain configuration.

The invention may best be understood by referring to the following detailed description and accompanying drawings which illustrate the invention. In the drawings:

FIGS. 1-3 illustrate schematic circuit diagrams of prior art systems, which diagrams are useful in understanding the problems associated with prior art compensation techniques and systems;

FIGS. 4a-b illustrate a plan view and a partial sectional view taken generally along section lines 4b—4b, respectively, of a component of a system constructed according to the present invention;

FIG. 5 illustrates a schematic circuit diagram of the component illustrated in FIGS. 4a-b;

FIGS. 6a-b illustrate a plan view and a fragmentary sectional view taken generally along section lines 6b—6b, respectively, of a prior art component;

Figure 9B:
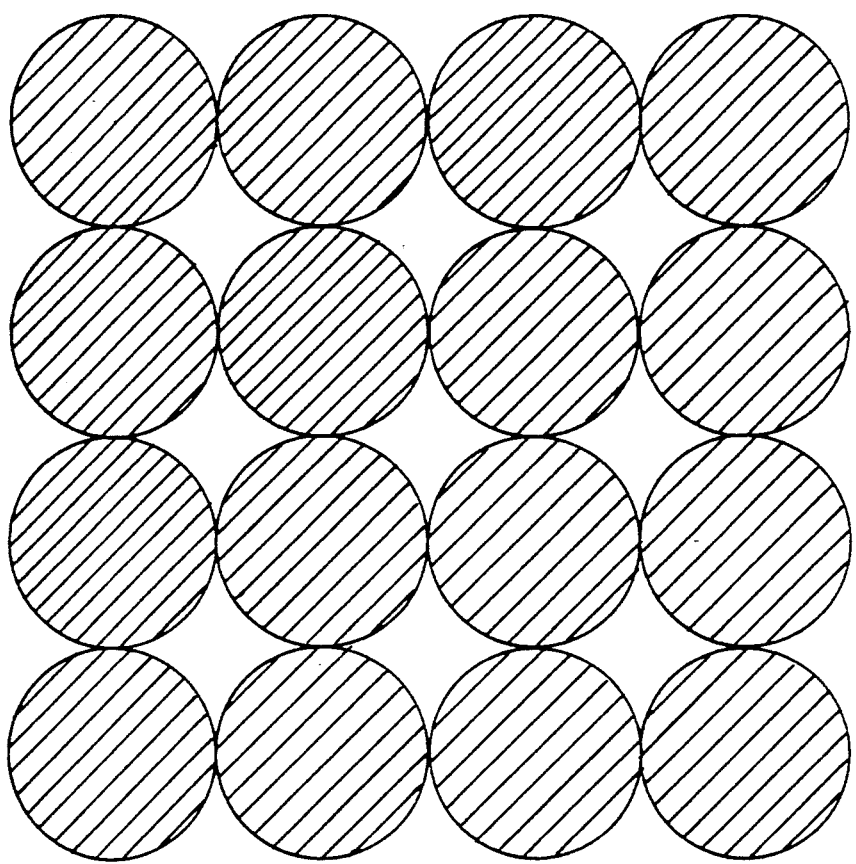
Figure 9A:
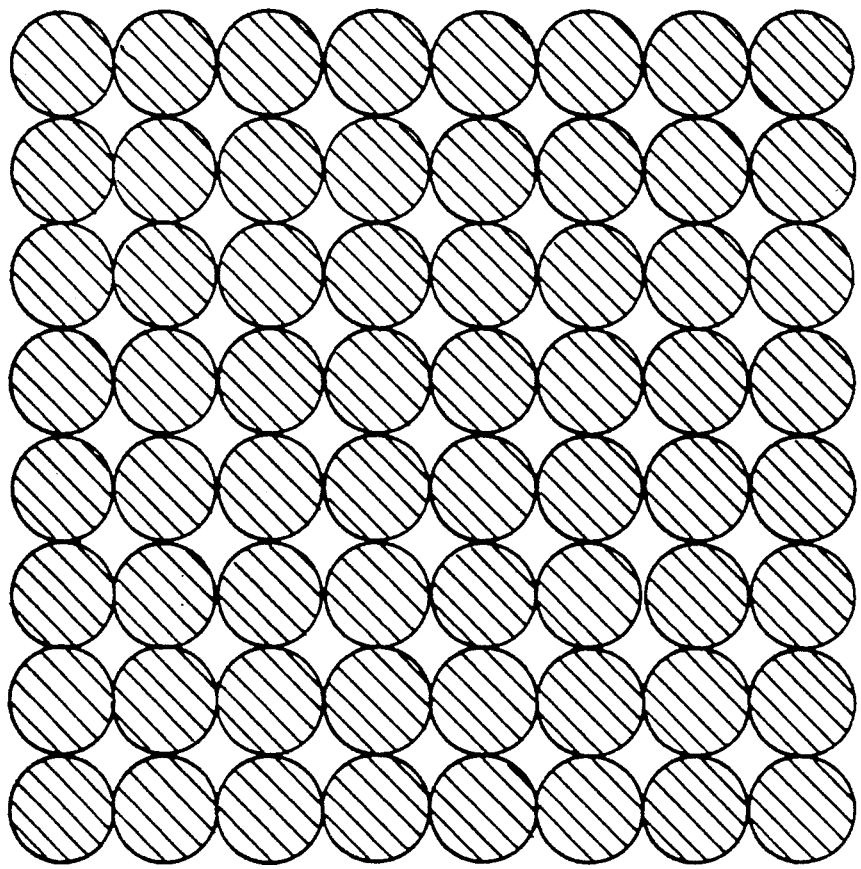
Figure 10:
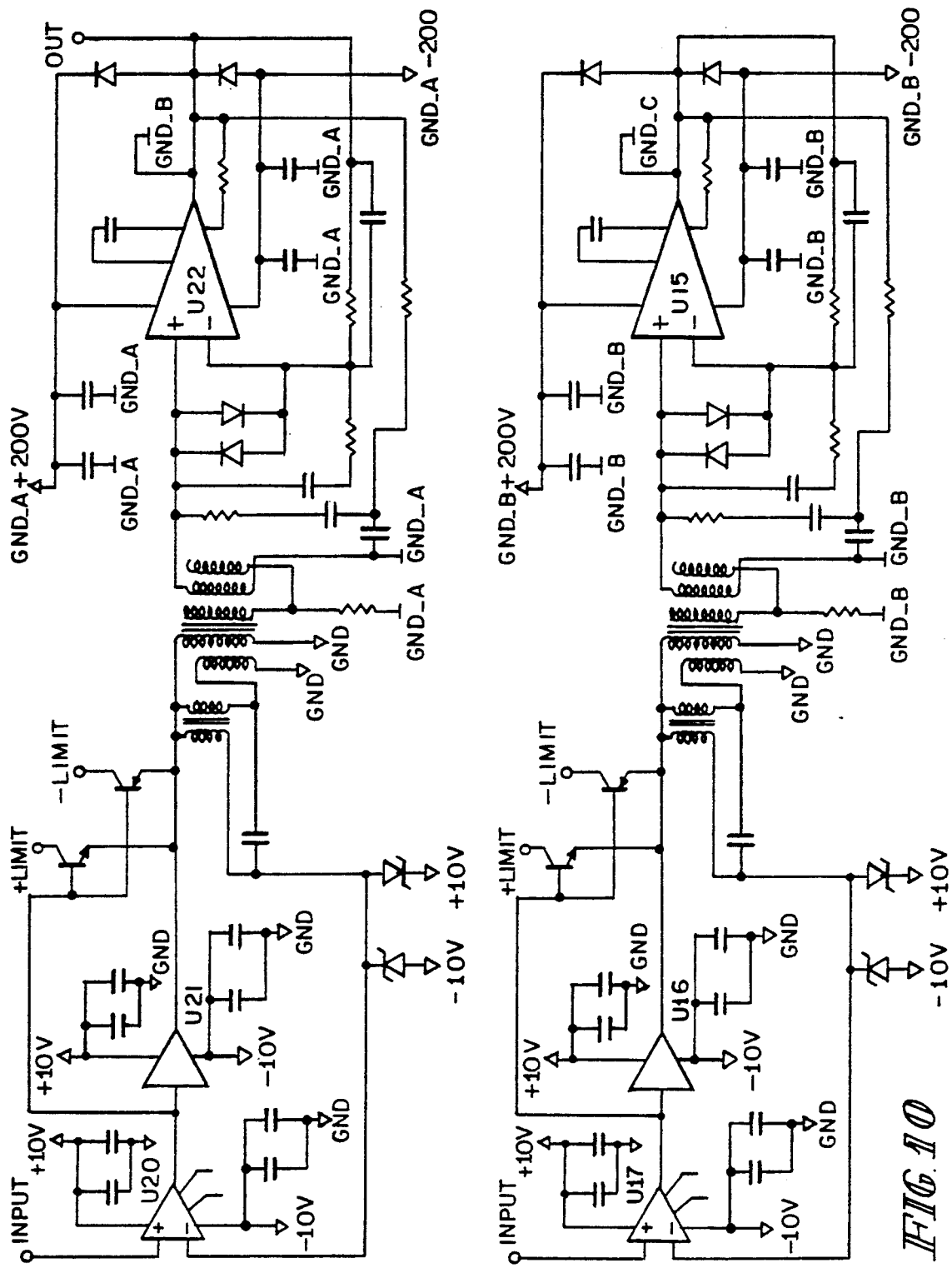
Figure 11:
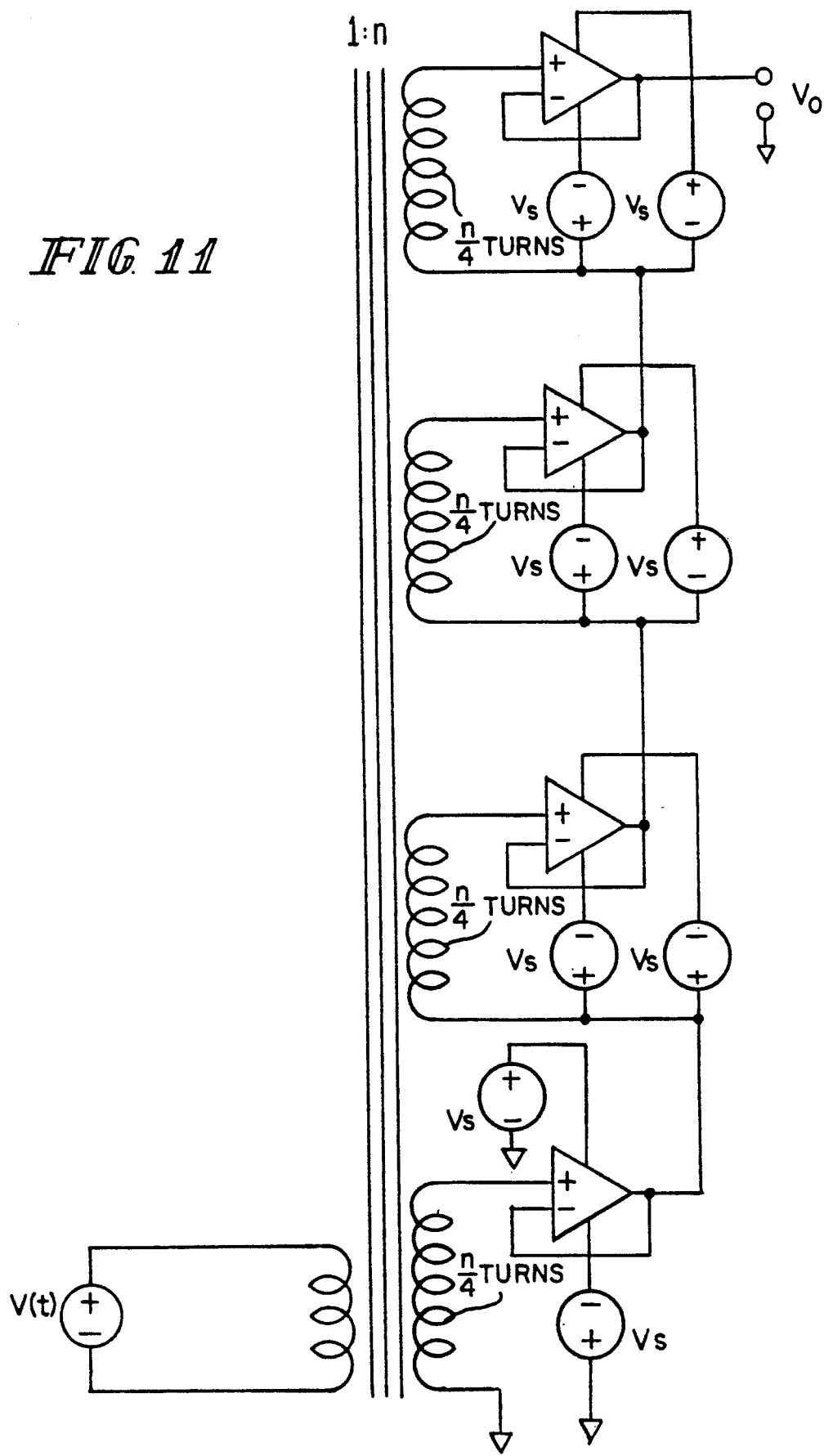

FIGS. 9a-b respectively illustrate a prior art winding technique and a winding technique according to the present invention;

FIG. 10 illustrates a schematic circuit diagram of a system constructed according to the present invention; and, FIG. 11 illustrates a schematic circuit diagram of a system constructed according to the present invention.

It has been discovered that additional windings can be used to create an electrostatic shield that reduces the effect of the winding capacitance to the rest of the universe, while overcoming a major limitation of the common method of shielding.

The common method of controlling capacitance to the rest of the universe is to place an electrostatic shield around the winding. When the winding is enclosed inside a shield, the capacitance the winding sees with respect to the rest of the universe is fixed by the shield's geometry. This forces the currents to flow in specific, stable patterns. Unfortunately, the capacitance has not been eliminated. In fact the capacitance has probably been increased by the presence of the shield. Undesirable currents still flow in the winding and these still induce voltage drops which affect the input to output voltage ratio. The effects have just been stabilized so that subsequent calibration can take them into account.

Figure 5:
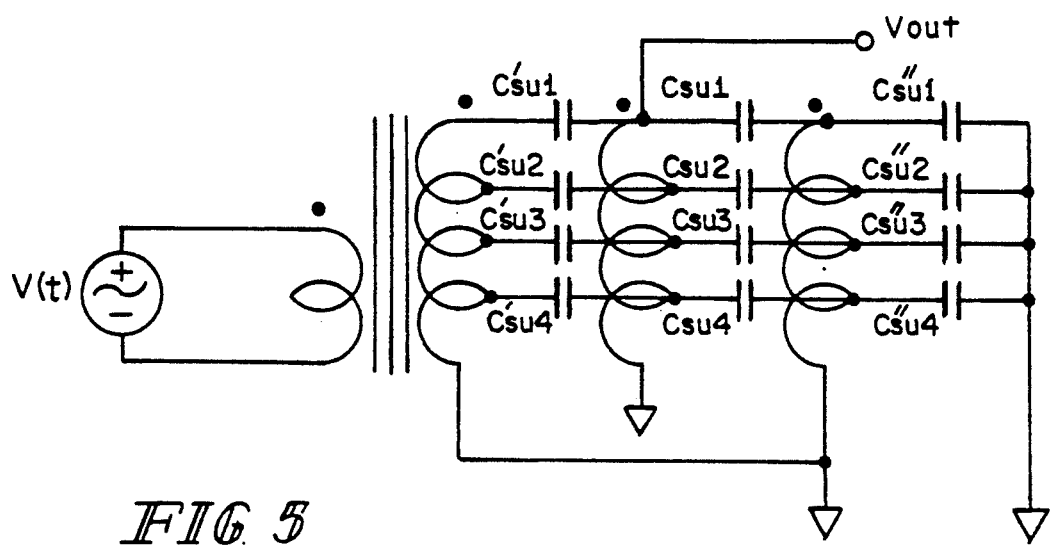

According to the invention a novel alternative to the traditional shield is to use additional secondary windings as a shield. If the additional windings completely surround the secondary winding, the additional windings act very much like a traditional shield in that nearly all the electric field between the secondary winding and the rest of the universe is actually between the secondary winding and the additional windings. An example of how this can be achieved is illustrated in FIG. 4. In FIG. 4, a toroidal transformer with three windings on it is illustrated. These windings are concentric around the toroidal core and the wire and spacing of the inner and outer winding are such that they approximate electrostatically opaque layers around the secondary winding. Each winding is wound on top of the preceding one. In view A—A the transformer has been sectioned to illustrate the windings from the side. The innermost winding provides a shield between the middle (secondary) winding and the core. The outer winding provides a shield between the secondary winding and the rest of the universe. All the electric field reaching the secondary winding comes from either the inner or outer winding. The inner and outer windings contain all the electric field linkages to the rest of the universe. A model for this configuration is illustrated in FIG. 5. The capacitors $C_{su1}$, $C_{su2}$, $C_{su3}$, $C_{su4}$, $C'_{su1}$, $C'_{su2}$, $C'_{su3}$, and $C'_{su4}$ are the capacitances between the inner and outer windings and the secondary winding. Capacitors $C''_{su1}$, $C''_{su2}$, $C''_{su3}$, and $C''_{su4}$, are the capacitances between the inner and outer shield windings and the rest of the universe.

The advantage in shielding a winding with a winding is as follows. If the shield windings have the same number of turns as the middle winding, start at the same location, are wound in the same direction, have the same number of turns per unit length, and are connected to the same voltage at one point, the voltages across adjacent windings at all points along the windings are zero. The distributed capacitance between adjacent windings is across this space. If the voltage across the capacitance between adjacent windings is zero, the current through the capacitance is also zero. With no current flow, the capacitors have no effect on the circuit. By this technique capacitors $C_{su1}$-$C_{su4}$ and $C'_{su1}$-$C'_{su4}$ are effectively eliminated. Theoretically no current is induced in the middle winding as a result of these capacitors. In reality there is some voltage mismatch between the shield windings and the middle windings and thus some small current flows. This can come from not perfectly matching locations for all the turns of all three coils when they are being wound. It can also be a direct consequence of the original problem. No matter how perfectly the three coils are wound, the turn to turn, layer to layer, and winding to universe capacitances still affect the inner and outer coils. This can cause the shield coils not to match the voltage of the middle coil at all points precisely. Even with these imperfections, the reduction is still substantial. Given what has been presented, it is now easy to see that a potential between the coil and shield that might once have been 120 VAC could easily be reduced to less than 1 VAC. With careful attention to geometry, several orders of magnitude of reduction in the effective capacitance between the shield windings and the secondary winding is readily available. The additional secondary capacitance developed by the shield winding does add additional load to the primary. Fortunately, the active circuit used to idealize the primary winding (see U.S. Ser. No. 07/905,114) is not significantly negatively impacted by this additional load.

By adding two windings of variable voltage shield, a technique has been developed that can give several orders of magnitude reduction in the capacitive (or electrostatic) coupling between a given potential winding and the rest of the universe. This means that errors in the potential transformer caused by this coupling have also been reduced proportionally.

In FIG. 3, the turn to turn and layer to layer capacitances that exist in the secondary coil of the potential transformer were identified as $C_{s1}$, $C_{s2}$, $C_{s3}$, and $C_{s4}$. Improving the capacitance to the rest of the universe has not effectively addressed this problem. The formula for the effective interlayer capacitance is

| where | | | |
|---|---|---|---|
| | $C_e = (4C_1/3n_1)(1 - 1/n_1)$ | | 1 |
| | $n_1 =$ | number of layers | 2 |
| | $C_1 =$ | 0.225 Ae/t picofarads = capacitance between adjacent layers | 3 |
| | $A =$ | (MLT)b inches$^2$ = area of winding layer | 4 |
| | MLT = | Mean Length of Turn in inches | 5 |
| | $b =$ | width of layer in inches | 6 |
| | $e =$ | dielectric constant of interlayer insulation | 7 |
| | $t =$ | thickness of interlayer insulation | 8 |

Figure 6A:
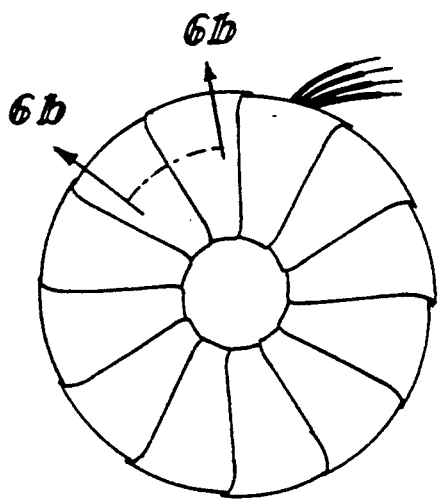
Figure 6B:
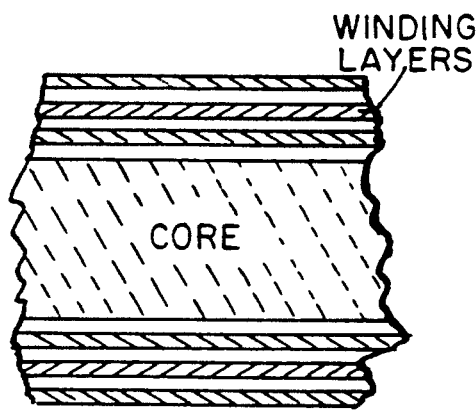
Figure 7:
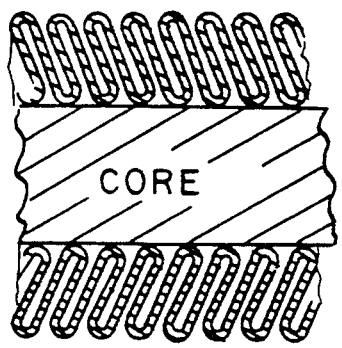
FIG. 7 illustrates a fragmentary sectional view of a modification according to the present invention of the system illustrated in FIG. 6b.

As can be seen from equation 1, Ce is reduced as the number of layers is increased and the areas of the layers are decreased. In a toroid, both of these goals can be achieved by modifying the winding technique. FIG. 6 illustrates a typical toroid with a high turn count coil that has been wound in layers. Section A'—A' in FIG. 6 illustrates how the layers are piled on top of one another as the winder goes around the toroid multiple times. There are relatively few layers and the capacitance of each layer is large. The capacitance is proportional to the area of the layer. The area is proportional to the width of the layer. The width of the layer is the full mean circumference of the toroid. The effective interlayer capacitance Ce is large. In FIG. 7 section A'—A', an alternate winding technique is illustrated. Here the winder only goes around the toroid once. It does, however, go back and forth as it winds to create layers that are much narrower than the mean circumference of the toroid. In addition the number of layers is much higher. These two techniques together significantly reduce the effective interlayer capacitance Ce. For example, if the width of the layer is reduced to 10% of its original value and the number of layers is multiplied by 10 to keep the total turns the same, the effective interlayer capacitance Ce is reduced by a factor of around 100.

Limitations in maximum supply voltages of operational amplifiers place limits on the maximum amplitude the output of an operational amplifier can reach. Although no absolute theoretical limit exists several practical limits do exist. Cost of the amplifiers increases dramatically as the maximum supply voltage increases. As supply voltages go to 480 VAC and above, it is advantageous to be able to split the buffering performed at the output of the potential transformer into several amplifiers. If this is not done, the supply voltages of the amplifier become too large. For example, if 480 VAC supplies are employed, the plus and minus supplies must be approximately $\pm 700$ V. If the $\pm 700$ V requirement is split into fourths, the $\pm 700$ V requirement can be reduced to $\pm 180$ V for each of four operational amplifiers.

Figure 8:
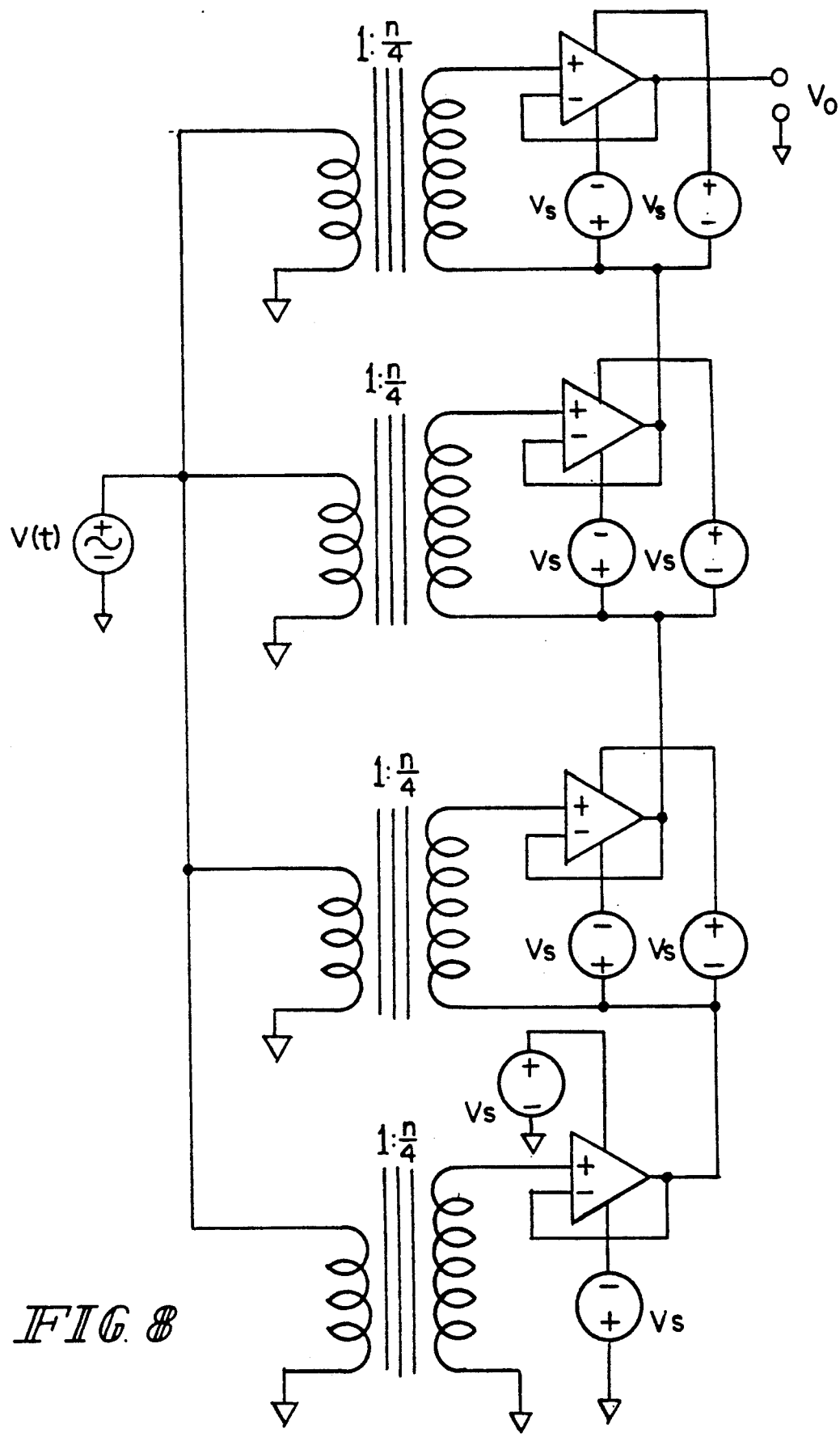
FIG. 8 illustrates a schematic circuit diagram of a system constructed according to the present invention.

FIG. 8 illustrates an effective 1:n potential transformer with output buffering that has been split into four individual circuits The turns ratio of each of the four transformers has been set to 1:n/4. The outputs of the stages are stacked in series. The differential supplies that power the operational amplifiers would be floating with respect to ground if they did not have their center voltage points attached to the output of the preceding stage. The inputs are all in parallel and referenced to the same point. This configuration permits each stage to employ $\pm 180$ V supplies for its operational amplifier, while achieving 480 VAC output for the entire circuit. Even with the duplication of input circuitry and transformers for each stage, the reduction in supply voltage required reduces the cost of the operational amplifier stages enough to be cost effective.

This circuit also provides a small additional advantage in its effect on secondary capacitance. Because the number of turns per coil has been reduced by four and little manufacturing advantage is gained in going to a smaller coil, space is provided to increase the wire size. The window left by the previous coil by doubling the wire diameter can be filled. This is illustrated in FIG. 9. FIG. 9 illustrates two windings that have been cut so that their individual conductors can be seen. The window area consumed by each winding is the same. The conductors on the right are exactly twice the diameter of the conductors on the left. The number of turns on the winding on the right is exactly one fourth of the turns of the winding on the left. The number of layers in the winding on the right is one half the number of layers of the winding on the left. If all four windings are considered, the number of layers being used to achieve the 1:n ratio has doubled. From equation 1, the effective capacitance of the secondary has nearly been halved. Since the cross-sectional area of the wire increased by a factor of four without increasing the MLT the resistance of the winding has been reduced by a factor of four. This reduction in resistance reduces the error voltages proportionally. By separating the secondary into four separate windings, the error effects have been reduced by a factor of eight, capacitance by a factor of 2 and resistance by factor of 4.

FIG. 10 illustrates an implementation of two of the stages according to the invention. The input to each stage is 5 VAC. All stages are driven from the same input. Each stage has its secondary side referenced to a pseudo ground. Two of these pseudo grounds have been labeled GND_A and GND_B in FIG. 10. The output voltage of each stage is 120 VAC with respect to its own pseudo ground. GND_A is the pseudo ground for the secondary side of the upper stage. GND_A comes from a preceding stage not illustrated on the schematic. GND_B originates at the output of U22 and provides the pseudo ground for the lower stage. The output of U15 provides a GND_C that is the pseudo ground for the next stage (not illustrated) below the lower stage illustrated in FIG. 10. The complete implementation for 480 VAC adds two more identical stacked stages.

U22 and U15 and their associated components are the output buffer amplifiers. U16, U17, U20 and U21 and the associated components to the left of the transformers provide the nearly ideal transformer primary described in U.S. Ser. No. 07/905,114. U22 and U15 also provide the drive for the stabilization circuitry also described in U.S. Ser. No. 07/905,114. The wound shield is illustrated as two windings with identical turns adjacent the secondary winding. The sectionalized winding is not specifically illustrated in FIG. 10.

The above circuitry can be further improved by returning to a single, larger core while maintaining the series stacking at the output. FIG. 11 illustrates this configuration. To determine that the circuit illustrated in FIG. 11 provides the same results as the circuit illustrated in FIG. 8, first consider how the circuit in FIG. 8 works. The primaries of the original four transformers are identical and idealized. Since they are connected to the same ideal voltage source, the same flux is driven into each core. Since the secondaries of each transformer are identical and they are driven by identical flux, each winding produces exactly the same output voltage. These secondaries have been stacked in series to produce the desired output. Referring to FIG. 11, the primary has been idealized by external circuitry. It is identical to the input circuitry illustrated in FIG. 8. Because it is ideal, it completely controls the flux in the core. The number of secondaries on the core cannot affect the flux in the core. The induced voltage at each secondary will be a function only of the flux induced by the primary. Thus, all the secondaries can be wound on one core. Since the secondary windings are identical and they all receive the same flux, and since this flux is identical to the flux the secondaries received in the circuit illustrated in FIG. 8 the circuit illustrated in FIG. 11 must have the same output as the circuit illustrated in FIG. 8. Stacking secondaries in this manner had no detrimental effect.

Functionally, the circuit illustrated in FIG. 11 is identical to the circuit illustrated in FIG. 8. The advantage of the circuit illustrated in FIG. 11 is that it accomplishes the same job as the circuit illustrated in FIG. 8 with but only one section of input circuitry. This saves having multiple input windings and circuits.

What is claimed is:

1. A system for increasing the voltage handling capacity of an amplifier circuit coupled to a transformer output, the transformer having a primary winding, the system comprising a transformer secondary winding divided into n sub secondary windings where n is an integer, means for coupling a first terminal of a first of the sub secondary windings to a reference potential, the amplification circuit comprising n amplifiers numbered sequentially $1 \leq m \leq n$ as they appear in the amplification circuit with an output terminal of the nth amplifier comprising an output terminal of the amplification circuit, each of the n amplifiers having an input terminal and an output terminal, means for coupling an input terminal of the first amplifier to a second terminal of the first sub secondary winding, means for coupling an output terminal of each of the n amplifiers to a first terminal of the next adjacent higher numbered sub secondary winding, except for the nth amplifier, the output of which comprises the output of the amplifier circuit, a first voltage supply, means for coupling the first voltage supply to the first amplifier to provide operating voltage to the first amplifier, means for coupling the first voltage supply to reference potential, $n-1$ additional voltage supplies, means for coupling each of the $n-1$ additional voltage supplies to a respective one of the $n-1$ remaining amplifiers to provide operating voltage thereto, and means for coupling each of the $n-1$ remaining voltage supplies to the output terminal of the next adjacent lower numbered amplifier.

2. The system of claim 1 wherein each of the n sub secondary windings has the same number of turns and the gain of each of the n amplifiers is substantially the same.

3. The system of claim 1 or 2 wherein each of the n amplifiers comprises a substantially unity gain amplifier.

4. The system of claim 3 wherein each of the n amplifiers comprises a difference amplifier, the said input terminal of each amplifier comprising the non-inverting input terminal of each difference amplifier, the said output terminal of each amplifier being coupled to that amplifier's inverting input terminal in substantially unity gain configuration.

* * * * *